(12) United States Patent
Chen

(10) Patent No.: US 8,115,116 B2
(45) Date of Patent: Feb. 14, 2012

(54) CASING WITH SHIELDING FUNCTION, METHOD FOR MANUFACTURING THE SAME AND ELECTRONIC DEVICE USING THE SAME

(75) Inventor: Chih-Pin Chen, Taipei (TW)

(73) Assignee: Asustek Computer Inc., Taipei (TW)

( * ) Notice: Subject to any disclaimer, the term of this patent is extended or adjusted under 35 U.S.C. 154(b) by 402 days.

(21) Appl. No.: 12/348,553

(22) Filed: Jan. 5, 2009

(65) Prior Publication Data

US 2009/0183913 A1    Jul. 23, 2009

(30) Foreign Application Priority Data

Jan. 18, 2008    (TW) ................................ 97102075 A

(51) Int. Cl.
*H05K 9/00*    (2006.01)
(52) U.S. Cl. ............... 174/386; 174/389; 174/392
(58) Field of Classification Search .......... 174/386, 174/389, 392; 361/816
See application file for complete search history.

(56) References Cited

U.S. PATENT DOCUMENTS

| | | | |
|---|---|---|---|
| 4,965,408 A * | 10/1990 | Chapman et al. | 174/363 |
| 5,761,054 A * | 6/1998 | Kuhn | 361/818 |
| 6,576,832 B2 * | 6/2003 | Svarfvar et al. | 174/392 |
| 6,630,623 B1 * | 10/2003 | Whitney et al. | 174/392 |
| 7,129,422 B2 * | 10/2006 | Arnold | 174/377 |
| 7,135,643 B2 * | 11/2006 | van Haaster et al. | 174/382 |
| 7,351,919 B1 * | 4/2008 | Knoke et al. | 174/382 |
| 7,446,265 B2 * | 11/2008 | Krohto et al. | 174/377 |
| 7,488,901 B2 * | 2/2009 | Arnold | 174/377 |
| 2008/0212304 A1 * | 9/2008 | Masuda et al. | 361/818 |

FOREIGN PATENT DOCUMENTS

| | | |
|---|---|---|
| CN | 1515394 A | 7/2004 |
| CN | 1627894 A | 6/2005 |
| CN | 1770973 A | 5/2006 |
| CN | 1872562 A | 12/2006 |
| TW | 526704 | 4/2003 |
| TW | 200634348 | 10/2006 |

* cited by examiner

*Primary Examiner* — Hung Ngo

(74) *Attorney, Agent, or Firm* — Rabin & Berdo, PC

(57) ABSTRACT

A casing with a shielding function, a method for manufacturing the same and an electronic device using the same are disclosed. The electronic device has at least an electronic element and a casing. The casing includes a casing substrate and a film integrally formed with the casing substrate via an in-mold decoration process. The film includes a shielding layer for providing an electromagnetic shielding function for the electronic element and an adhesive layer for combining the casing substrate and the shielding layer.

12 Claims, 7 Drawing Sheets

CASING WITH SHIELDING FUNCTION, METHOD FOR MANUFACTURING THE SAME AND ELECTRONIC DEVICE USING THE SAME

This application claims the benefit of Taiwan application Serial No. 97102075, filed Jan. 18, 2008, the subject matter of which is incorporated herein by reference.

BACKGROUND OF THE INVENTION

1. Field of the Invention

The invention relates to a casing and, more particularly, to a casing with an electromagnetic shielding function.

2. Description of the Related Art

Recently, with the progress of the communication technology, manufacturers generally pay attention to the electromagnetic interference when they develop and manufacture electronic devices (such as various portable or handheld electronic devices). However, the mainstream electronic devices on the market emphasize the characteristics such as lightness and slimness, and therefore, light plastic is often used to make the casings of the devices. The plastic is the non-conducting material, and it cannot provide the electromagnetic shielding function for the electronic device.

Conventionally, to allow the electronic device to have the electromagnetic shielding function, a layer of aluminum foil for shielding the electronic elements in the device is disposed at the inner surface of the casing after the casing manufacture is finished. However, the aluminum foil should be attached to the inner surface of the casing after positioned manually. Thus, the producing steps are complex and time-consuming.

BRIEF SUMMARY OF THE INVENTION

The invention relates to a shield casing, a method for manufacturing the same and an electronic device using the same. A shielding layer is directly integrated to the casing to allow the casing to have the electromagnetic shielding function.

The invention provides a casing with a shielding function. The casing is adapted to an electronic device having at least an electronic element, and it includes a casing substrate and a film integrally formed with the casing substrate via an in-mold decoration (IMD) process. The film includes a shielding layer and an adhesive layer combining the casing substrate with the shielding layer. The shielding layer is used to shield the electronic element to provide an electromagnetic shielding function for the electronic element.

The invention further provides an electronic device including at least an electronic element and a casing coving the electronic element. The casing includes a casing substrate and a film integrally formed with the casing substrate via the IMD process. The film includes a shielding layer and an adhesive layer combining the casing substrate with the shielding layer. The shielding layer shields the electronic element to provide an electromagnetic shielding function for the electronic element.

The invention further provides a method for manufacturing a casing. The method is used to process a casing substrate, and it includes the steps of providing a film including a shielding layer and an adhesive layer and integrally forming the film and the casing substrate via an IMD process to make the adhesive layer combine the casing substrate with the shielding layer to form a casing. The shielding layer is used for providing the electromagnetic shielding function for the electronic element.

These and other features, aspects, and advantages of the present invention will become better understood with regard to the following description, appended claims, and accompanying drawings.

DETAILED DESCRIPTION OF THE EMBODIMENTS

Figure 1A:
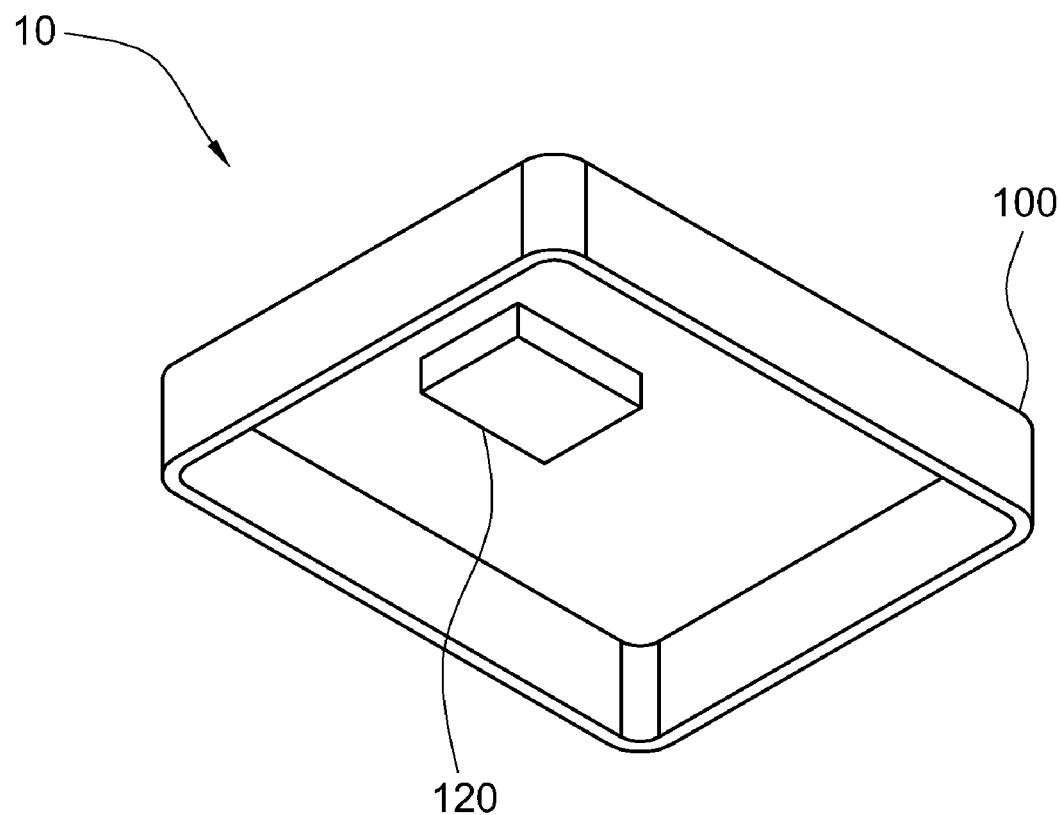
FIG. 1A is a schematic diagram showing the electronic device according to a preferred embodiment of the invention.
Figure 1B:
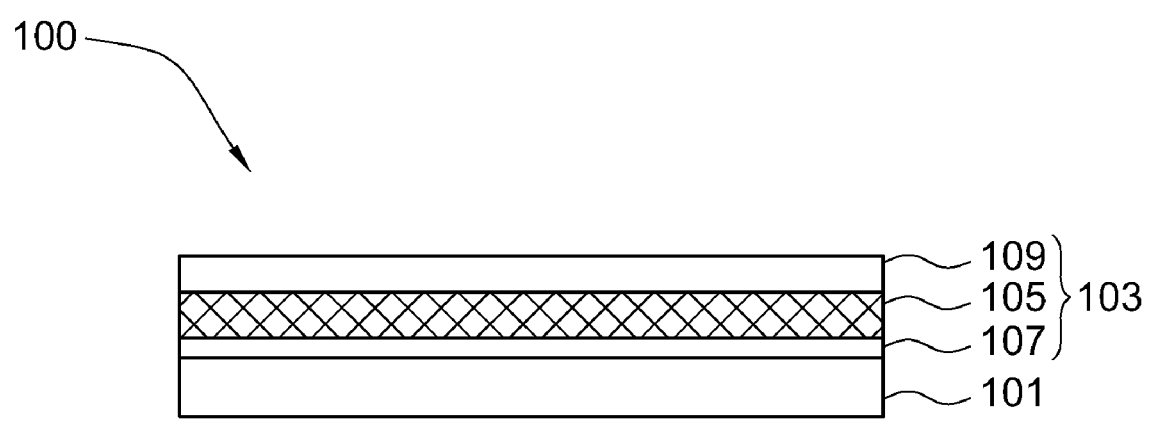
FIG. 1B is a sectional diagram showing part of the shield casing in FIG. 1A.

FIG. 1A is a schematic diagram showing the electronic device according to a preferred embodiment of the invention. FIG. 1B is a sectional diagram showing part of the shield casing shown in FIG. 1A. As shown in FIG. 1A and FIG. 1B, the electronic device 10 includes a shield casing 100 and at least an electronic element 120. The shield casing 100 covers the electronic element 120. The shield casing 100 includes a casing substrate 101 and a film 103 integrally formed with the casing substrate 101 via an IMD process. The film 103 includes a shielding layer 105 which may be made of a conductive or permeability material. Preferably, the shielding layer 105 may be a metal layer (such as the copper foil) for providing an electromagnetic shielding function for the electronic element 120.

As shown in FIG. 1B, the film 103 includes an adhesive layer 107 for combining the casing substrate 101 and the shielding layer 105. In addition, preferably, the film 103 further has a protective layer 109 disposed on the shielding layer 105. The protective layer 109 is used to prevent the shielding layer 105 from being separated. The protecting layer 109 may be a transparent film.

In addition, in view of the appearance design of the electronic device 10, preferably, the shield casing 100 may be designed to have different color or patterns.

Figure 2:
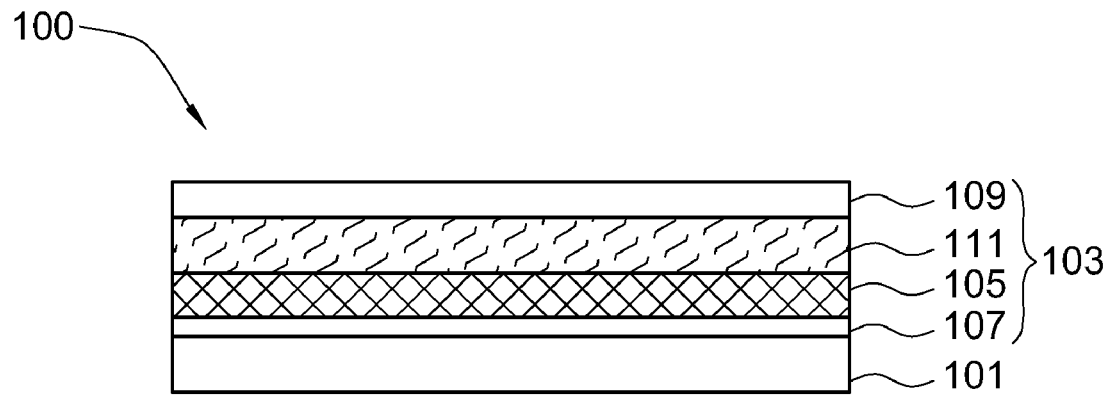
FIG. 2 is a sectional diagram showing that the shield casing in FIG. 1B has a coloring layer.

FIG. 2 is a sectional diagram showing that the shield casing in FIG. 1B has a coloring layer. As shown in FIG. 2, the film 103 has a coloring layer 111 between the shielding layer 105 and the protective layer 109. The coloring layer 111 may be colorful ink to allow the shield casing 100 to be a casing with a specific color.

Figure 3:
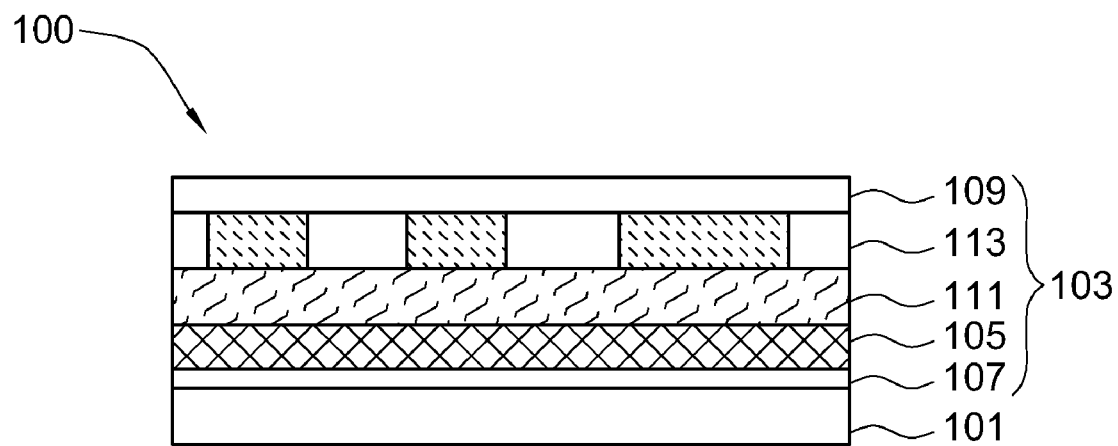
FIG. 3 is a sectional diagram showing that the shield casing in FIG. 2 has a pattern layer.

FIG. 3 is a sectional diagram showing that the shield casing in FIG. 2 has a pattern layer. Compared with the FIG. 2, the film 103 in FIG. 3 has a pattern layer 113 between the coloring layer 111 and the protective layer 109. The pattern layer 113 is a layer with pattern design (such as the trademark pattern of the manufacturer) to allow the shield casing 100 to have various and colorful appearance pattern besides a specific ground color.

Although the pattern layer 113 is disposed between the coloring layer 111 and the protective layer 109 directly in FIG. 3, the invention is not limited thereto. In other embodiments, the film 103 may not have the coloring layer 111, and it may only have a pattern layer 113 disposed between the shielding layer 105 and the protective layer 119.

Figure 4:
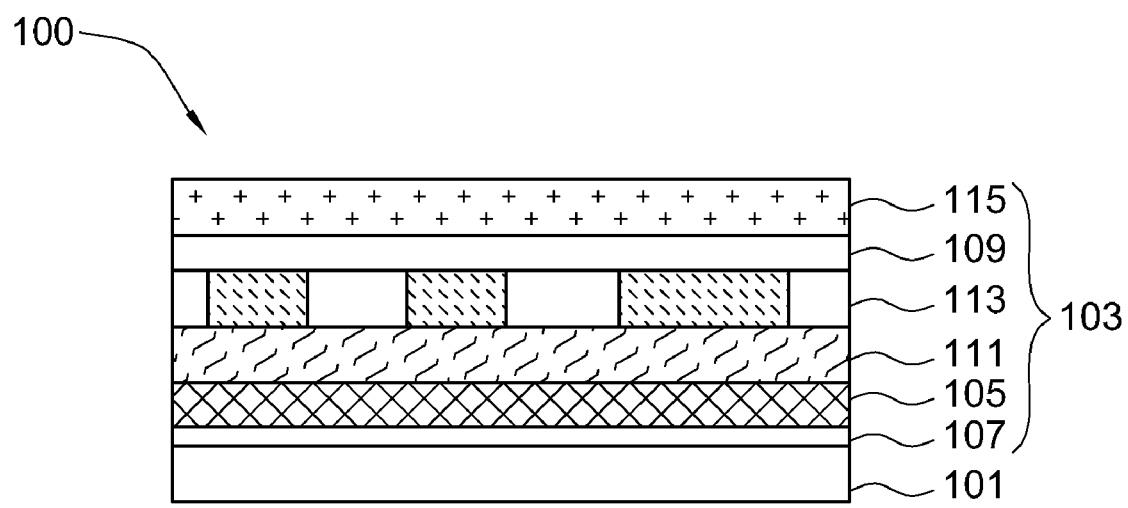
FIG. 4 is a sectional diagram showing that the shield casing in FIG. 3 has a foil layer.

In addition, FIG. 4 is a sectional diagram showing that the shield casing in FIG. 3 has a foil layer. The film 103 has a foil layer 115 provided on the protective layer 109. The foil layer 115 is a hard coat layer preferably disposed on the relatively outer position of the casing. Thus, the whole shield casing 100 has a hard surface. The foil layer 115 also may be disposed between other layers. For example, the foil layer 115 may be disposed between the shielding layer 105 and the coloring layer 111 or between the protective layer 119 and the pattern layer 113. In other embodiments, the film 103 may only have the foil layer 115 and the protective layer 109 on the shielding layer 105 without the coloring layer 111 and the pattern layer 113.

Figure 5:
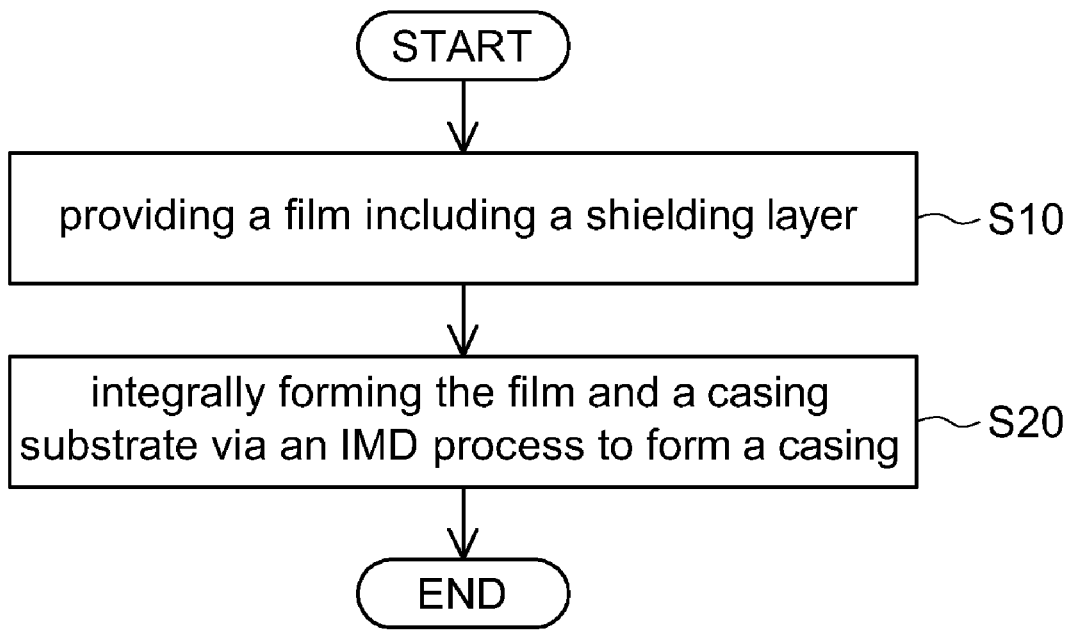
FIG. 5 is a flow chart showing the method for manufacturing the shield casing according to a preferred embodiment of the invention.

The method for manufacturing the shield casing is described hereinbelow with the appended drawings. FIG. 5 is a flow chart showing the method for manufacturing the shield casing according to the preferred embodiment of the invention. As shown in FIG. 5, the method for manufacturing the shield casing includes the steps S10 and S20. In the steps S10, a film is provided first. The film includes a shielding layer. In the step S20, the film and the casing substrate are integrally formed via the IMD process to form a casing. The shielding layer is used for providing the electromagnetic protecting function.

In the step S10, different layers are manufactured in sequence on a sheet according to the composition of the film when the film is manufactured. The methods for manufacturing the films of the shield casings in FIG. 1B to FIG. 4 are described hereinbelow.

Figure 6:
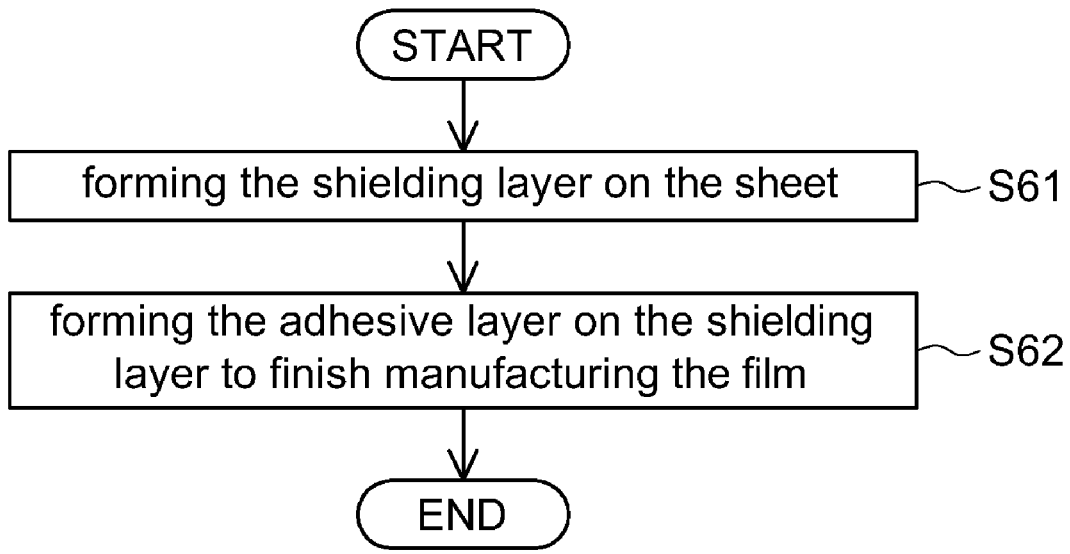
FIG. 6 is a flow chart showing the method for manufacturing the film of the shield casing in FIG. 1B.
Figure 7A:
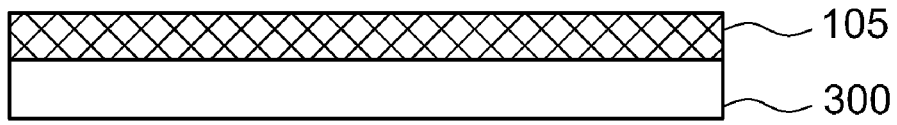
FIG. 7A to FIG. 7B are schematic diagrams showing the film manufactured in sequence corresponding to the steps in FIG. 6.
Figure 7B:
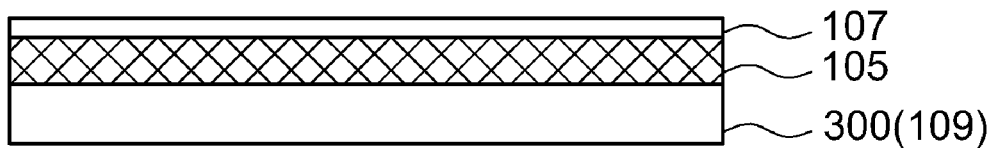

FIG. 6 is a flow chart showing the method for manufacturing the film of the shield casing in FIG. 1B, and FIG. 7A and FIG. 7B are schematic diagrams showing the film manufactured in a sequence corresponding to the steps in FIG. 6. In FIG. 1B, the film 103 of the shield casing 100 includes an adhesive layer 107, a shielding layer 105 and a protective layer 109. When the film is manufactured, the layers are formed on a sheet in sequence. As shown in FIG. 6, the method for manufacturing the film includes the steps S61 and S62.

In the step S61, as shown in FIG. 7A, the shielding layer 105 is formed on a sheet 300 first. Then, in the step S62, as shown in FIG. 7B, the adhesive layer 107 is formed on the shielding layer 105 to finish manufacturing the film. Afterward, the film and the casing substrate 101 (shown in FIG. 1B) are integrally formed. Herein, the IMD process may be in an in-mold forming (IMF) or in-mold rolling (IMR) manner for manufacturing the shield casing 100.

Taking the IMF as example, preferably, the sheet with the film is cut to have proper size, and it is put into a mold. After the material (generally, plastic) of the casing substrate 101 is fed into the mold, the material of the casing substrate 101 is formed in the mold and is combined with the film. In the above mode of integrally forming, the sheet 300 directly remains in the casing 100 to be the protective layer 109 (as shown in FIG. 1B).

The IMR is different from the IMF. In the mode of IMR, after the film and the casing substrate 101 are integrally formed, the sheet 330 is separated from the casing 100 and cannot to be used as the protective layer 109.

Figure 8:
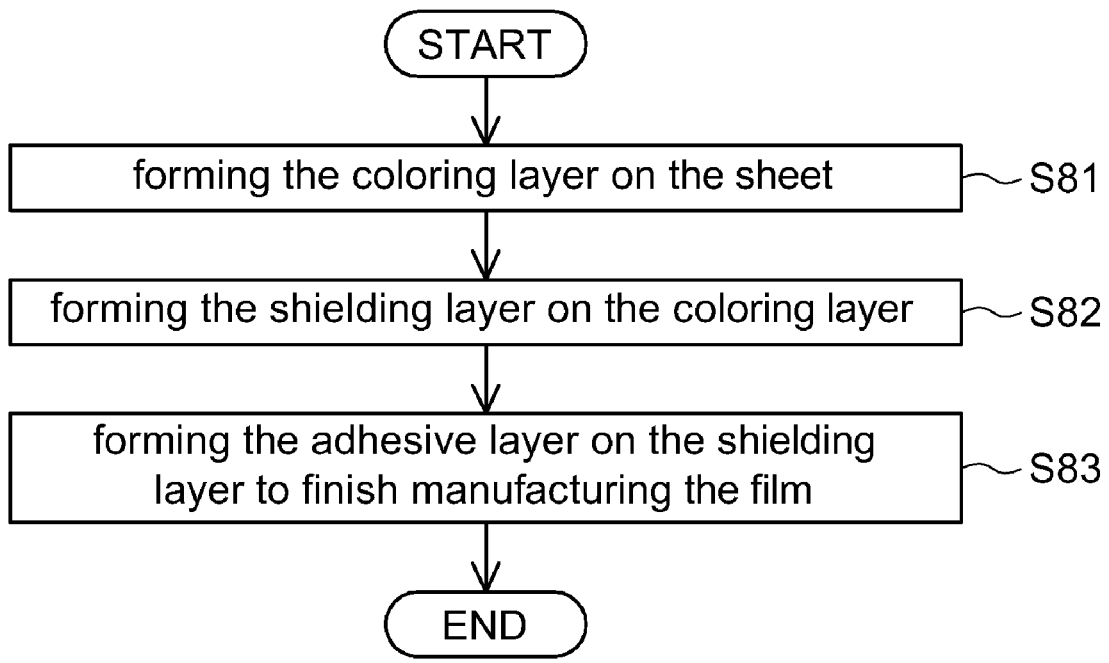
FIG. 8 is a flow chart showing the method for manufacturing the film of the shield casing in FIG. 1B.
Figure 9A:
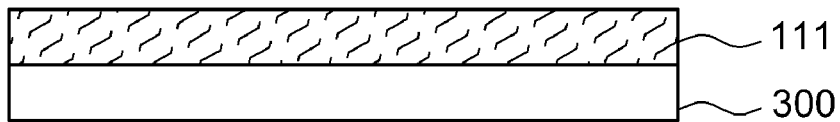
FIG. 9A to FIG. 9C are schematic diagrams showing the film manufactured in sequence corresponding to the steps in FIG. 8.
Figure 9B:
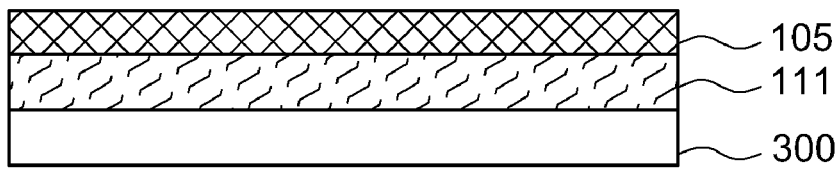
Figure 9C:
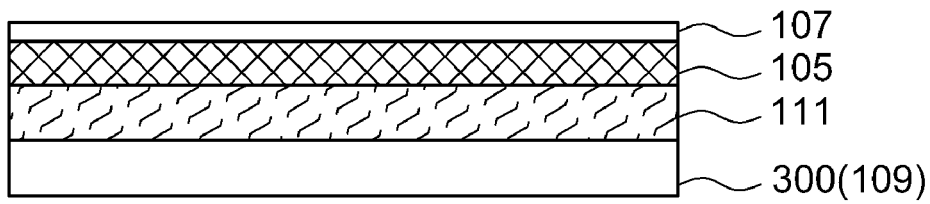

FIG. 8 is a flow chart showing the method for manufacturing the film of the shield casing in FIG. 2. FIG. 9A to FIG. 9C are schematic diagrams showing the film manufactured in sequence corresponding to the steps in FIG. 8. In FIG. 2, the film 103 of the shield casing 100 includes the adhesive layer 107, the shielding layer 105, the coloring layer 111 and the protective layer 109. When the film is manufactured, the layers are formed in sequence on the sheet. As shown in FIG. 8, the method for manufacturing the film includes the steps S81 to S83.

In the step S81, as shown in FIG. 9A, the coloring layer 111 is formed on the sheet 300 first. Then, in the step S82, as shown in FIG. 9A, the shielding layer 105 is formed on the coloring layer 111. Afterward, as shown in the step S83 and the FIG. 9C, the adhesive layer 107 is formed on the shielding layer 105 to finish manufacturing the film. Afterward, the film and the casing substrate 101 are integrally formed. The sheet 300, for example, remains on the casing 100 to be the protective layer 109.

Figure 10:
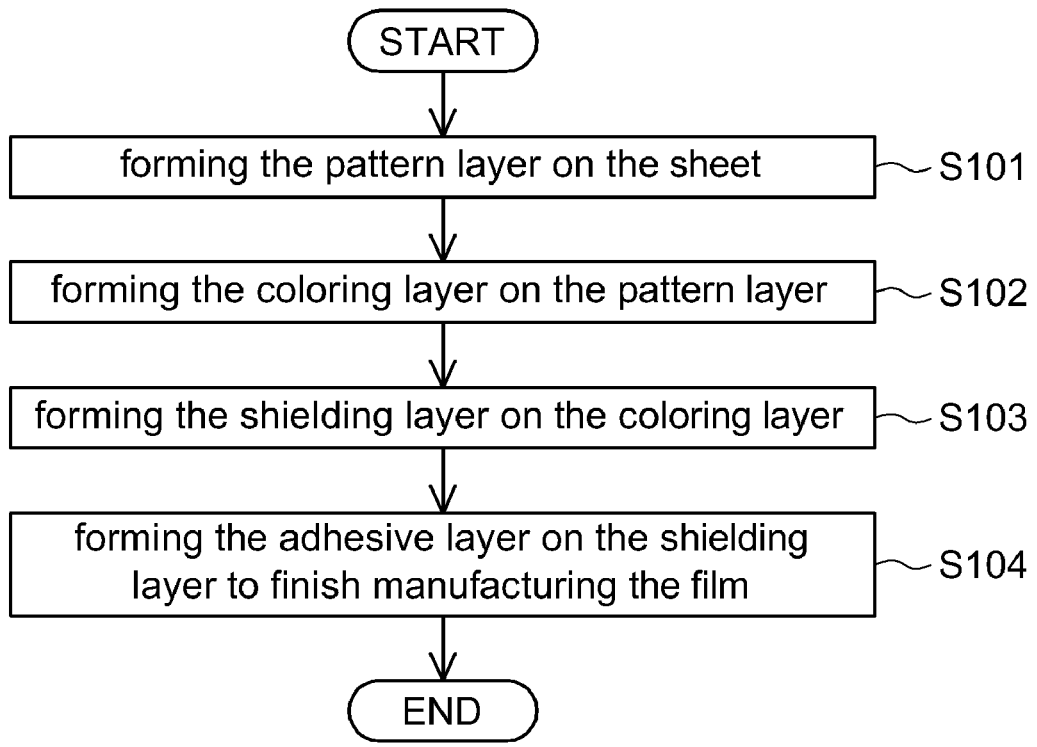
FIG. 10 is a flow chart showing the method for manufacturing the film of the shield casing in FIG. 3.

FIG. 10 is a flow chart showing the method for manufacturing the film of the shield casing in FIG. 3. In FIG. 3, the film 103 of the shield casing 100 includes the adhesive layer 107, the shielding layer 105, the coloring layer 111, the pattern layer 113 and the protective layer 109. When the film is manufactured, the layers are formed in sequence on the sheet. In the step S101, the pattern layer 113 is formed on a sheet (such as the protective layer 109). The pattern layer 113 is manufactured in a printing mode. As shown in the step S102, the coloring layer 111 is formed on the sheet 300. Afterward, in the step S103, the shielding layer 105 is formed on the coloring layer 111. Then, in the step S104, the adhesive layer 107 is formed on the shielding layer 105 to finish manufacturing the film. Afterward, the film and the casing substrate 101 are integrally formed.

Figure 11:
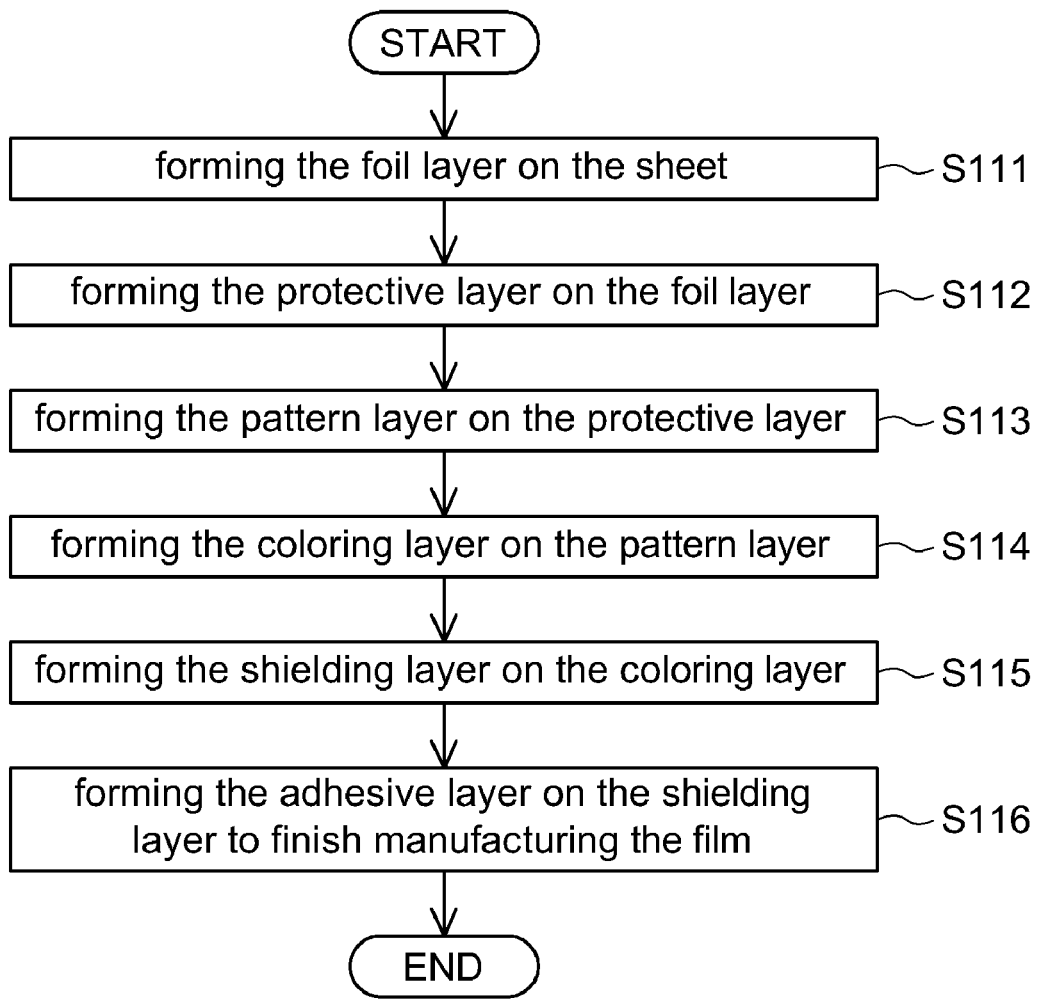
FIG. 11 is a flow chart showing the method for manufacturing the film of the shield casing in FIG. 4.

FIG. 11 is a flow chart showing the method for manufacturing the film of the shield casing in FIG. 4, and FIG. 12A to FIG. 12F are schematic diagrams showing the film manufactured in sequence corresponding to the steps in FIG. 11. In FIG. 4, the film 103 of the shield casing 100 includes the adhesive layer 107, the shielding layer 105, the coloring layer 111, the pattern layer 113, the protective layer 109 and the foil layer 115. When the film is manufactured, the layers are formed in sequence on the sheet.

Figure 12A:
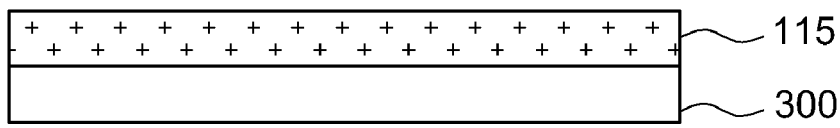
FIG. 12A to FIG. 12F are schematic diagrams showing the film manufactured in sequence corresponding to the steps in FIG. 11.
Figure 12B:
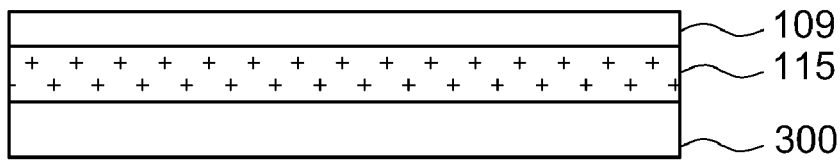
Figure 12C:
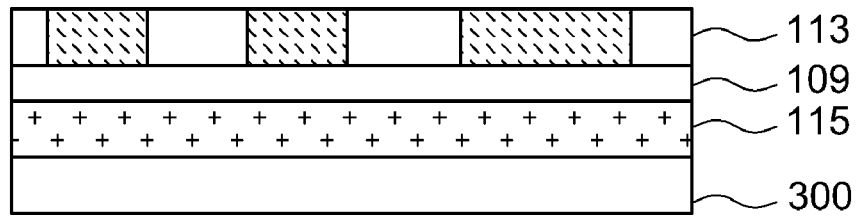
Figure 12D:
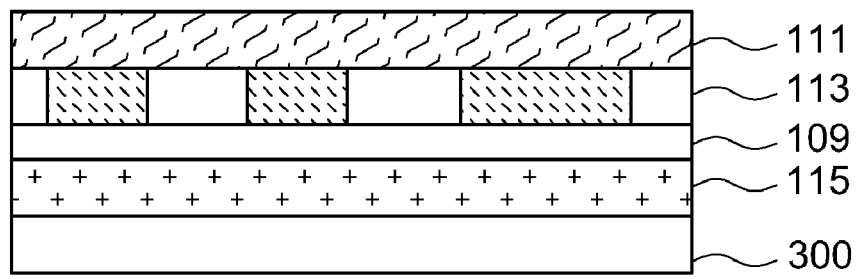
Figure 12E:
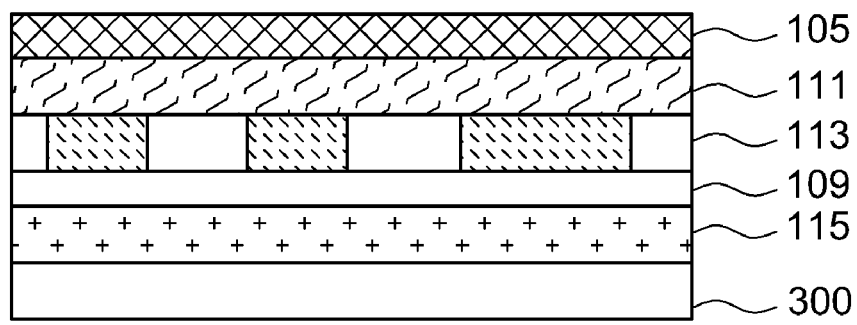
Figure 12F:
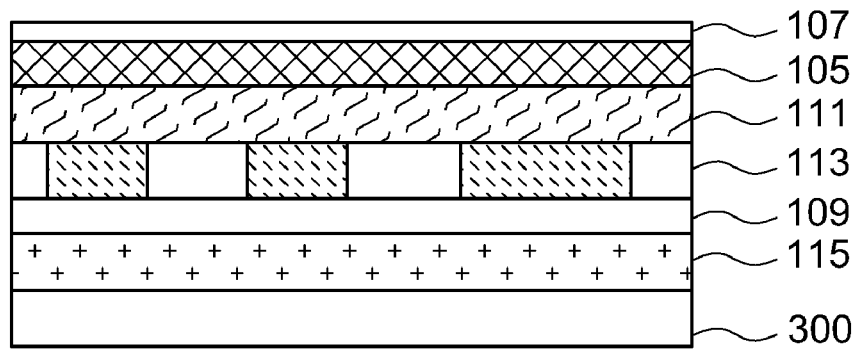

As shown in the step S111, the foil layer 115 is formed on the sheet 300 (as shown in FIG. 12A) first. Then, in the steps S112 and S113, the protective layer 109 is formed on the foil layer 115 (as shown in FIG. 12B). Afterward, the pattern layer 113 is formed on the protective layer 109 (as shown in FIG. 12C). As the steps S114 to S116 shown, the coloring layer 111 is formed on the pattern layer 113 (as shown in FIG. 12D), and then the shielding layer 105 is formed on the coloring layer 111 (as shown in FIG. 12E). Afterward, the adhesive layer 107 is formed on the shielding layer 105 (shown in FIG. 12F). Then, the film and the casing substrate 101 are integrally formed. The sheet 300 may directly remain on the casing 100 to be the protective layer which is the outermost layer, or it may be separated from the casing 100.

For the shield casing, the method manufacturing the same and the electronic device using the same disclosed in the embodiments, the shielding layer is integrated to the casing when the casing is manufactured. Thus, the casing has an electromagnetic shielding function. In addition, compared with conventional technology in which a layer of aluminum foil is additionally disposed at the inner surface of the casing to shield the electronic elements in the device, the shield casing of the invention saves the step of attaching the aluminum foil manually, which simplifies the manufacturing process.

Although the present invention has been described in considerable detail with reference to certain preferred embodiments thereof, the disclosure is not for limiting the scope of the invention. Persons having ordinary skill in the art may make various modifications and changes without departing from the scope and spirit of the invention. Therefore, the scope of the appended claims should not be limited to the description of the preferred embodiments described above.

What is claimed is:

1. A casing having a shielding function and adapted to an electronic device having at least an electronic element, comprising:
   a casing substrate; and
   a film integrally formed with the casing substrate, the film including:
      a shielding layer shielding the electronic element to provide the electronic element with an electromagnetic shielding function;
      a protective layer covering the shielding layer;
      a foil layer disposed on the protective layer; and
      an adhesive layer combining the casing substrate with the shielding layer.

2. The casing according to claim 1, wherein the film further comprises a coloring layer disposed between the shielding layer and the protective layer to allow at least a color to appear at the casing.

3. The casing according to claim 1, wherein the film further comprises a pattern layer disposed between the shielding layer and the protective layer to allow at least a pattern to appear at the casing.

4. The casing according to claim 1, wherein the foil layer contacts the protective layer.

5. The casing according to claim 1, wherein the protective layer is a transparent film.

6. An electronic device, comprising:
   at least an electronic element; and
   a casing covering the electronic element, the casing including:
      a casing substrate; and
      a film integrally formed with the casing substrate, the film including a foil layer, a protective layer, a shielding layer and an adhesive layer, the protective layer covering the shielding layer, the foil layer being disposed on the protective layer, the shielding layer shielding the electronic element to provide the electronic element with an electromagnetic shielding function, and the adhesive layer combining the casing substrate with the shielding layer.

7. The electronic device according to claim 6, wherein the film further comprises a coloring layer disposed between the shielding layer and the protective layer to allow at least a color to appear at the casing.

8. The electronic device according to claim 6, wherein the film further comprises a pattern layer disposed between the shielding layer and the protective layer to allow at least a pattern to appear at the casing.

9. The electronic device according to claim 6, wherein the foil layer contacts the protective layer.

10. The electronic device according to claim 6, wherein the protective layer is a transparent layer.

11. A casing having a shielding function and adapted to an electronic device having at least an electronic element, comprising:
   a casing substrate; and
   a film integrally formed with the casing substrate, the film comprising:
      a shielding layer shielding the electronic element to provide the electronic element with an electromagnetic shielding function;
      a pattern layer formed on the shielding layer;
      a foil layer disposed on the pattern layer;
      a protective layer formed on the foil layer; and
      an adhesive layer combining the casing substrate with the shielding layer.

12. An electronic device comprising:
   at least an electronic element; and
   a casing covering the electronic element, the casing including:
      a casing substrate; and
      a film integrally formed with the casing substrate, the film including a protective layer, a foil layer, a pattern layer, a shielding layer and an adhesive layer, the pattern layer being formed on the shielding layer, the foil layer being disposed on the pattern layer, the protective layer being formed on the foil layer and the shielding layer shielding the electronic element to provide the electronic element with an electromagnetic shielding function, and the adhesive layer combining the casing substrate with the shielding layer.

* * * * *